United States Patent [19]
Inoue et al.

[11] Patent Number: 5,791,767
[45] Date of Patent: Aug. 11, 1998

[54] SEMICONDUCTOR EXPOSURE DEVICE

[75] Inventors: Osamu Inoue; Kiyotada Nakamura, both of Himeji; Takashi Mori, Kawasaki; Tetsuo Kikuchi, Tokyo, all of Japan

[73] Assignee: Nikon Corporation, Tokyo, Japan

[21] Appl. No.: 417,591

[22] Filed: Apr. 7, 1995

Related U.S. Application Data

[63] Continuation-in-part of Ser. No. 118,459, Sep. 8, 1993, abandoned.

Foreign Application Priority Data

Sep. 9, 1992 [JP] Japan ............................ 4-265605

[51] Int. Cl.$^6$ .................................................. F21V 23/00
[52] U.S. Cl. ........................ 362/268; 362/263; 362/295; 315/291
[58] Field of Search .................................. 315/307, 308, 315/291; 362/263, 265, 268, 295

[56] References Cited

U.S. PATENT DOCUMENTS

| | | | |
|---|---|---|---|
| 3,611,191 | 10/1971 | Altman et al. | 331/94.5 |
| 3,816,794 | 6/1974 | Snyder | 315/194 |
| 4,001,637 | 1/1977 | Gray | 315/194 |
| 4,097,781 | 6/1978 | Koizumi et al. | 315/176 |
| 4,179,640 | 12/1979 | Larson et al. | 315/47 |
| 4,328,445 | 5/1982 | Van Den Plas et al. | 315/46 |
| 4,335,330 | 6/1982 | Peters et al. | 313/486 |
| 4,418,300 | 11/1983 | Otani et al. | 313/573 |
| 4,485,333 | 11/1984 | Goldberg | 315/149 |
| 4,497,015 | 1/1985 | Konno et al. | 362/268 |
| 4,673,843 | 6/1987 | Okanuma | 313/570 |

FOREIGN PATENT DOCUMENTS 4-137349  5/1992  Japan .
5-33003   8/1993  Japan .

OTHER PUBLICATIONS

Ushio Discharge Lamps, product information from Ushio Denke. (no date).

*Primary Examiner*—Alan Cariaso

[57] ABSTRACT

A semiconductor exposure device having excellent throughput using a mercury lamp as an exposure light source. The mercury lamp is capable of providing an efficient i-ray output, with a small i-ray half width value, allowing correction of chromatic aberration. The semiconductor exposure device is further provided with an illumination optical system for illuminating a target surface and a projection optical system for projecting the image on the target surface. The illumination optical system is provided with the mercury lamp, an optical integrator, an optical system for guiding a flux of light emitted from the mercury lamp to the optical integrator and a condenser lens for converging the light from the optical integrator. The semiconductor exposure device is provided with a power source and an associated control circuit for supplying an electric current to the mercury lamp. The power source is configured to allow the mercury lamp to have an average electric field E satisfying the following relational expression with respect to the lamp input power $W_L$ (W), provided that the value obtained by deducting 11 V from the lamp voltage $V_L$ (V) of the mercury lamp and dividing the difference by the electrode-to-electrode distance d (mm) is the average electric field E $(=V_L-11/d)$ (V/mm):

$$E_p(W_L)-1.0 \text{ V/mm} \leq E \leq E_p(W_L)+1.5 \text{ V/mm,}$$

wherein $E_p(W_L)=a+bW_L$; $E \leq 6$ V/mm; a and b are constants (a=1.4 V/mm, b=0.71×10$^{-3}$ V/mm·W).

3 Claims, 5 Drawing Sheets

1

SEMICONDUCTOR EXPOSURE DEVICE

CROSS-REFERENCE TO RELATED APPLICATION

This application is a continuation-in-part of U.S. application Ser. No. 08/118,459 filed on Sep. 8, 1993, now pending.

BACKGROUND OF THE INVENTION

1. Field of the Invention

The present invention relates to an exposure device for manufacturing semiconductors, and more particularly to an exposure device equipped with a mercury lamp that has a narrow i-ray (365 nm) half width and can output an i-ray with high efficiency.

2. Description of the Related Art

A reduction injection type exposure device using a projection optical system has been employed for manufacturing semiconductor devices having ultrafine patterns such as LSI and VLSI. The resolution R and depth of focus DOF of the reduction injection type exposure device largely determines how fine a pattern can be transferred. The resolution R and the depth of focus DOF are related to a numerical aperture NA and an exposure wavelength λ of a projection optical system by:

$$R=K_1 \cdot \lambda/NA, \quad DOF=K^2 \cdot \lambda/NA^2 \text{ (where } K_1, K_2 \text{ are constants)}$$

As can be seen, increasing the numerical aperture NA of the projection optical system and shortening the exposure wavelength λ, facilitates the transfer of finer patterns. Recently, projection optical systems having a numerical aperture of 0.5 to 0.6 have been realized and are contributing to the refining of patterns.

A wafer must be subjected to light exposure to form a circuit pattern during the manufacturing of semiconductors. A large depth of focus is necessary to absorb any errors due to the flatness of the wafer itself. As such, it is advantageous to improve definition by shortening the exposure wavelength λ. A luminescent line of a mercury lamp, called a g-ray (436 nm), has conventionally been utilized as the exposure light source for exposing a wafers. Recently, a luminescent line, called an i-ray, with a shorter wavelength (365 nm) has been predominantly utilized as the exposure light source.

The semiconductor device industry is tending toward larger chip areas having ever finer patterns. Thus, the area of a chip which can be exposed by one shot of an exposure device must also be enlarged correspondingly. For example, a 15 mm×15 mm square exposure area has been used predominantly in the prior art, but an exposure area of 20 mm×20 mm square or more is desired. To improve throughput in an exposure device having such great exposure area, it is necessary to increase the dose of light exposure on the wafer surface.

A short arc type mercury lamp is typically used as the exposure light source in exposure devices. In the short arc type mercury lamp, predetermined amounts of mercury are sealed in a quartz glass bulb with a start-up rare gas, and a direct current is applied across tungsten electrodes to effect a discharge emission. In such short arc type mercury lamps, a flux of ultraviolet light, with high efficiency and high luminance, can be relatively easily obtained. Further, the handling of the associated optical system is straightforward. Thus, the short arc type mercury lamp is considered a preferable light source. Typically, an increase of the flux of ultraviolet light emitted from the mercury lamp is achieved by increasing the input power or by increasing the operation pressure of the mercury.

FIG. 1 is a chart showing a distribution of the potential between the electrodes of a short arc type mercury lamp. A steep voltage drop Vc is displayed, near the cathode, while another steep voltage drop Va is displayed near the anode. These voltage drops Vc and Ac may be assumed to be constant values (Vc=10 V, Va=1 V), and are irrespective of the electrode material, the amount of mercury sealed in the bulb, as well as the kind and amount of start-up rare gas (see, for example, P Gerthsen und P. Schulz: A. Physik 140, 510 (1955)). Accordingly, if the lamp voltage is $V_L$ (V) the voltage drop in the positive column is Vp (V), and the electrode-to-electrode distance is d (mm), Vp can be expressed by Vp=$V_L$−11. The average electric field E in the luminous arc (positive column) may then be expressed by E=($V_L$−11)/d. It should be noted that the expression "average" refers to the average value of the electric field, because the electric field varies slightly, depending on the position during arcing.

Provided that the effective electric power contributing to light emission is $W_{ef}$ (W) and the lamp current is $I_L$ (A), the following relationship is established: $W_{ef}=I_L \cdot (V_L-11)$. Which, given ($V_L$−11)=E·d, can be expressed as $W_{ef}=I_L \cdot E \cdot d$. Accordingly, to secure a high $W_{ef}$ value, to increase the flux of ultraviolet light emitted from the lamp, the lamp current $I_L$ must be increased. The lamp voltage can be increased, by securing a greater electrode-to-electrode distance d, to provide a greater $W_{ef}$. However, the arc will be so large that the luminance will be lowered. Accordingly, it is difficult to design an efficient optical system having an increased $W_{ef}$.

The average electric field E is mainly influenced by the pressure of mercury and secondly influenced by the amount of the rare gas sealed in the lamp. While mercury becomes a gas while the lamp is lit, the operation pressure of mercury can be defined by the amount of solid mercury sealed in the lamp at manufacture.

FIG. 2 is a chart showing a typical spectral distribution of a mercury lamp. The spectral distribution of the light emitted from the mercury lamp displays various luminescent line spectra and low levels of continuous spectra. Such distribution is mostly determined by the pressure of the mercury sealed in the lamp. The higher the mercury pressure is, the broader the luminescent lines, also the higher the continuous spectra. This makes it difficult to correct chromatic aberration in the projection optical system.

The breadth of the luminescent line of known i-rays (365 nm) is very limited, since the kinds of optical glass materials employed in a dioptric system are extremely limited. This makes correction of chromatic aberration difficult. It is necessary to use an i-ray having a small half width value. However, the half width value of an i-ray emitted from known mercury lamps, for example a Deep UV lamp, has not always been satisfactory when used as an exposure light source.

FIG. 3 is a chart showing the relationship between the average electric field and the i-ray spectral distribution. If the average electric field E is increased, by elevating the operation pressure of the mercury sealed in the lamp, the effective power $W_{ef}$ contributing to light emission will increase. However, if the operation pressure of the mercury sealed in the lamp exceeds a predetermined level, the i-ray output is lowered. The i-ray output drops when the operation pressure of the mercury sealed in the lamp is increased to intensify the average electric field E. Accordingly, the operation pressure of the mercury sealed in the lamp cannot be increased without limitation. Meanwhile, increasing the input power leads to increases in the size of the lamp, which in turn, increases the size of the exposure device. Such increases lead to difficulty in heat dissipation.

SUMMARY OF THE INVENTION

Accordingly, it is an object of the present invention to provide a semiconductor exposure device which enjoys excellent throughput using a high luminance mercury lamp as an exposure light source which can efficiently yield i-ray output having a small half width value sufficient to correct chromatic aberration.

Objects of the present invention are achieved by regulating the value of the average electric field in an arc formed between the electrodes in a high luminance mercury lamp during operation.

Objects of the present invention are achieved in a semiconductor exposure device provided with an illumination optical system for illuminating a target surface, the illumination optical system comprises a mercury lamp, an optical integrator, an optical system for guiding a flux of light emitted from the mercury lamp to the optical integrator and a condenser lens for converging the light from the optical integrator, a projection optical system for projecting the image on the target surface, a power source for supplying an electric current to the mercury lamp, the power source adapted to allow the mercury lamp to have an average electric field E which satisfies $E_p(W_L)-1.0$ V/mm$\leq E \leq E_p(W_L)+1.5$ V/mm; where $W_L$ is the lamp input power and wherein $E=(V_L-11)/d$, where $V_L$ is the lamp voltage and d is the electrode to electrode distance, and wherein $E_p(W_L) = a+bW_L$; $E \leq 6$ V/mm, where a and b are constants (a=1.4 V/mm, b=0.71×10$^{-3}$ V/mm·W).

Objects of the present invention are further achieved in an i-ray having a narrow half wherein 90% or more of the peak i-ray illuminance is secured under a constant lamp input power by satisfying the above relational expression between the average electric field E and the lamp input power $W_L$.

Objects of the present invention are also achieved in a high luminescent mercury lamp in which the operation pressure of mercury and the average electric field are regulated, taking the amount of rare gas to be sealed and the electrode-to-electrode distance into consideration, to increase the i-ray illuminance or obtain an i-ray having a narrow half width.

BRIEF DESCRIPTION OF THE DRAWINGS

These and other objects and advantages of the invention will become apparent and more readily appreciated from the following description of the preferred embodiments, taken in conjunction with the accompanying drawings of which.

DESCRIPTION OF THE PREFERRED EMBODIMENT

Figure 1:
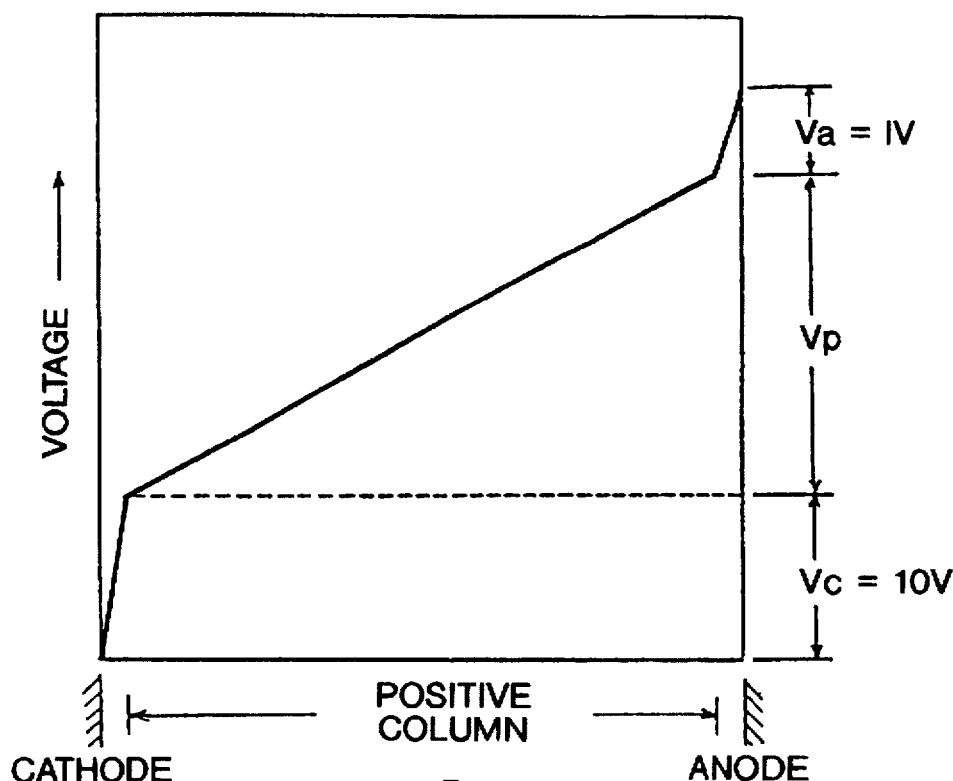
FIG. 1 is a chart showing a distribution of potential between the electrodes of a mercury lamp.
Figure 2:
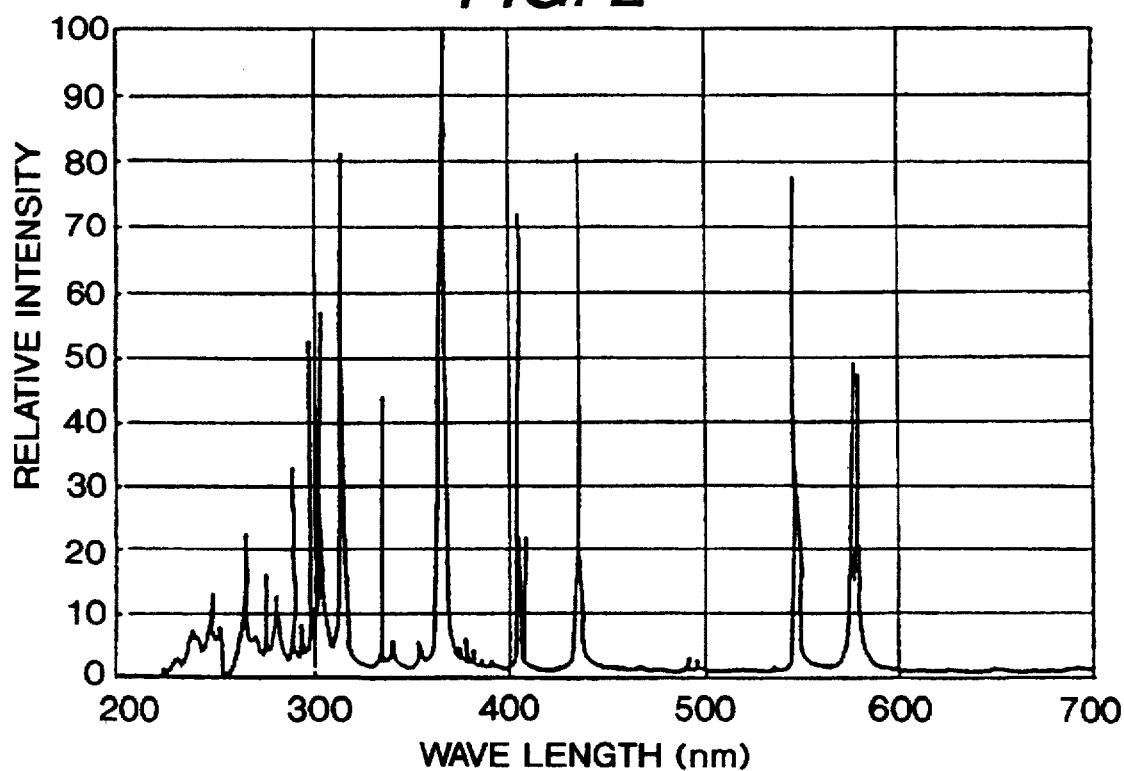
FIG. 2 is a chart showing a typical spectral distribution of a mercury lamp.
Figure 3:
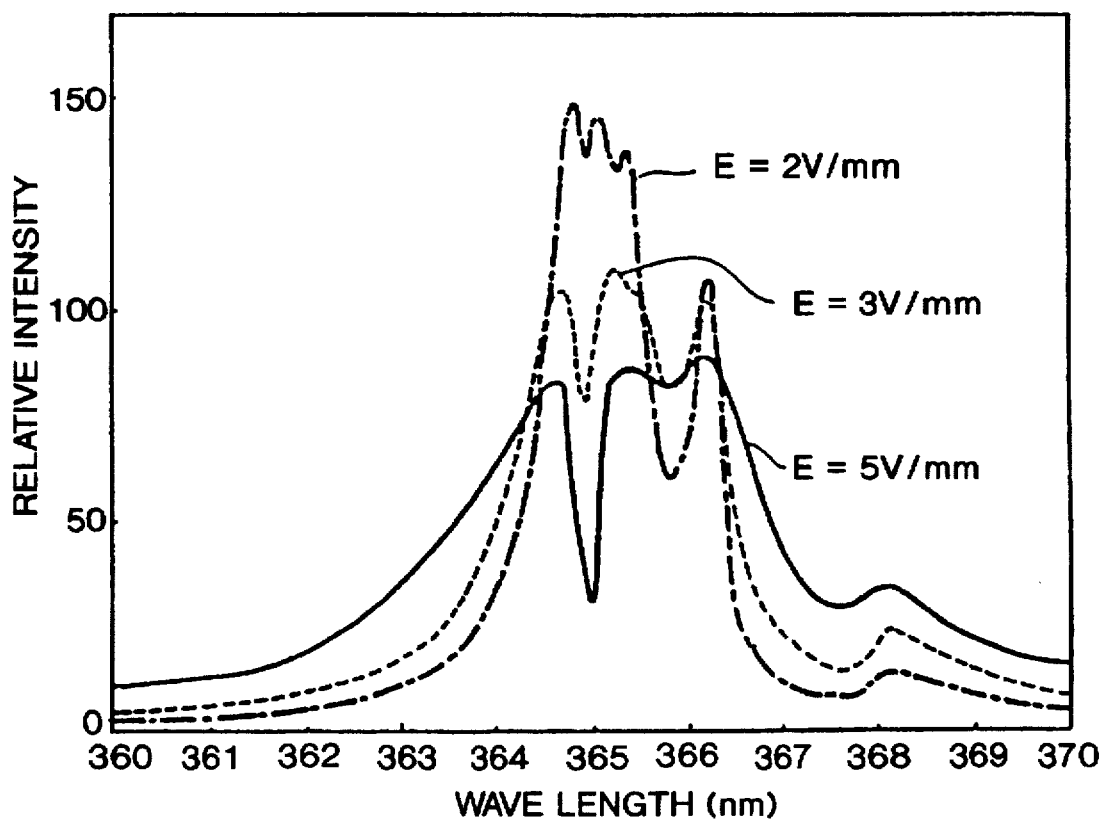
FIG. 3 is a chart showing a relationship between an average electric field and an i-ray spectral distribution.

Reference will now be made in detail to the present preferred embodiments of the present invention, examples of which are illustrated in the accompanying drawings, wherein like reference numerals refer to like elements throughout.

Figure 4:
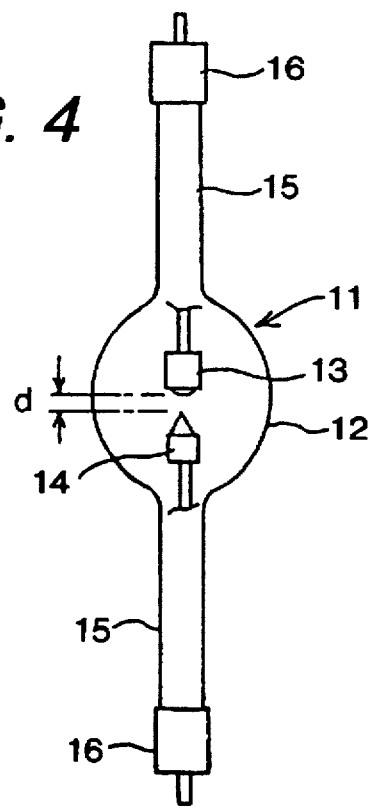
FIG. 4 is a diagram of a mercury lamp.

FIG. 4 is a diagram of a mercury lamp employed as an exposure light source in a semiconductor exposure device in accordance with a preferred embodiment of the present invention. A quartz glass bulb 11 has an expanded emission space 12, with a pair of sealing tubes 15 extending from each side. A pair of metal caps 16 are fitted to the end portions of the sealing tubes 15. An anode 13 and a cathode 14, preferably made of tungsten, are disposed in the expanded emission space 12 to oppose to each other, separated by an electrode-to-electrode distance d. Mercury and a start-up rare gas, in predetermined amounts, are sealed in the bulb 11. A discharge emission can be obtained by applying a direct current across the anode 13 and the cathode 14. The mercury lamp preferably has an electrode-to-electrode distance d of about 2 to 7 mm, and a lamp input power in the range of 500 to 5000 W. A suitable mercury lamp is selected depending on the purpose. For example, a mercury lamp SUV-2000NI, manufactured by Ushio, Inc., having an electrode-to-electrode distance d of 4.5 mm can be used with a lamp input power of 1750 W (rated voltage 26V, rated current 67 A).

Figure 5:
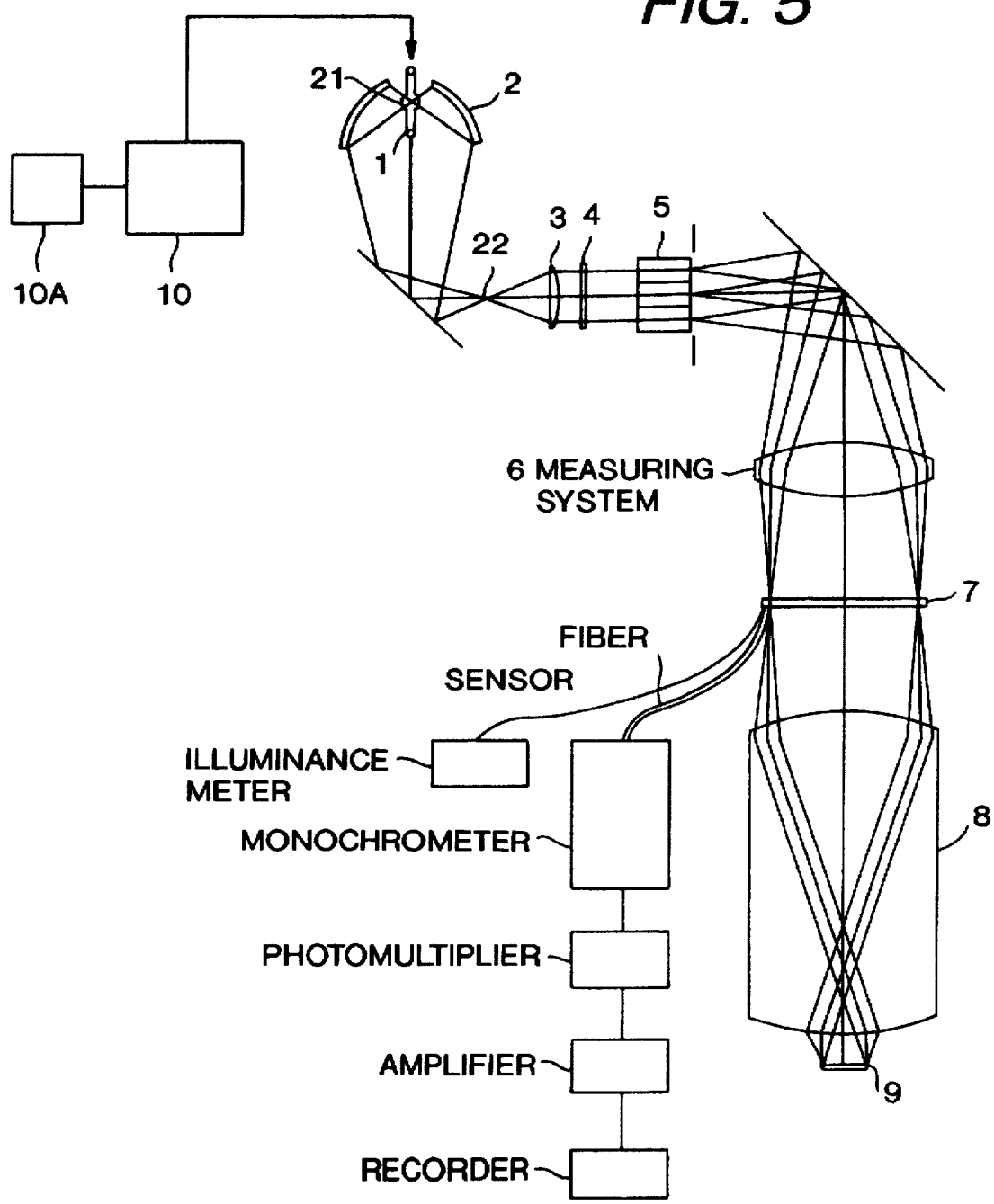
FIG. 5 is a diagram of a typical illumination optical system for a semiconductor exposure device.

FIG. 5 is a diagram of an illumination optical system for a semiconductor exposure device using a mercury lamp as an exposure light source. A mercury lamp 1 is disposed at a first focal point 21 of an oval mirror 2. A power source 10, having an associated control circuit 10A, supplies a direct current to the mercury lamp 1. The flux of light emitted from the mercury lamp 1 is converged by the oval mirror 2 to form a secondary image at a second focal point 22 thereof. The light emitted from the secondary light source image is converted into a substantially parallel light flux through a collimeter lens 3 and enters a so-called band path filter 4 having a narrower band. An exposure wavelength is selected by the band path filter 4 and enters an optical integrator 5. The optical integrator 5 forms a multiplicity of tertiary light source images from the substantially parallel light flux. Subsequently, the light emitted from the multiplicity of tertiary light source images is converged through a condenser lens 6 to illuminate a reticle pattern 7 (the target surface to be irradiated) overlappingly. The profile of the reticle pattern 7 is reduced, through a projection optical system 8, and projected onto a wafer 9. An associated measuring system is provided to assist in controlling exposure. The measuring system generally comprises an illuminance meter, a monochrometer, a photomultiplier, an amplifier, and a recorder.

Figure 6:
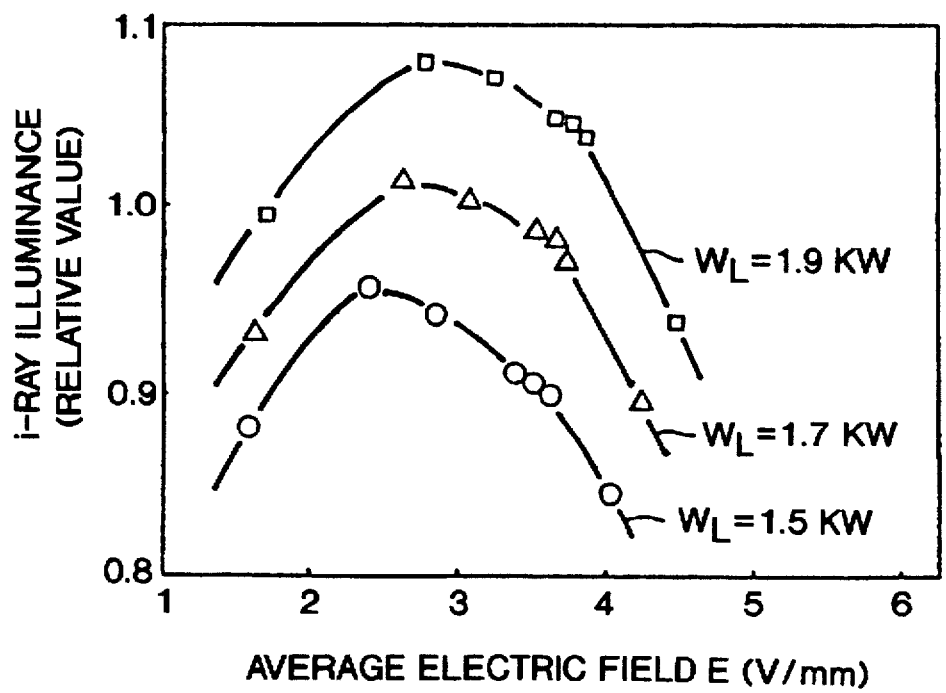
FIG. 6 is a chart showing a relationship between an average electric field and an i-ray illuminance.

FIG. 6 is a chart showing the relationship between the average electric field E of the mercury lamp 1 and illuminance of the i-ray on the target surface 7 (reticle surface) in the illumination optical system as shown in FIG. 5. The mercury lamps, used to produce the results given in FIG. 6, all have the same electrode-to-electrode distance (4.5 mm), the same electrode shape and the same arc tube inner volume (ca. 50 cc), but contain different amounts of mercury sealed therein. Thus, the mercury lamps are capable of providing a consistent efficiency in the optical system. The amounts of sealed mercury used varied: 2.0 mg/cc, 4.0 mg/cc, 5.0 mg/cc, 5.5 mg/cc, 5.8 mg/cc, 6.0 mg/cc and 7.0 mg/cc, in this order, as shown from left to right in FIG. 6. Further, 1 atm. of a xenon gas was sealed in each arc tubes.

Namely, seven mercury lamps, each having different mercury pressures, were lit by varying the input power (lamp input power) 1.5 kw, 1.7 kw and 1.9 kw, with results as shown in FIG. 6. The average electric field E of the mercury lamps and the illuminance of the i-ray on the target surface are plotted in FIG. 6. The illuminance values as measured are relative to the luminance (equal to 1) produced when the lamp input power is 1.7 kw and the amount of mercury sealed is 5.0 mg/cc. The results show that the i-ray illuminance characteristic curves all have peaks, for any lamp input power, and the profiles of the respective illuminance characteristic curves are substantially the same. This is presumably because the effective power $W_{ef}$ contributing to light emission increases, as the average electric field E increases in the region where $E<E_p(W_L)$ (provided that the average electric field where the i-ray illuminance assumes a peak value is $E_p(W_L)$) to increase the i-ray illuminance. The possibility that the light emitted from the excited mercury is absorbed by the mercury atoms rises as the average electric field E increases to induce notable self absorption, leading to the reduction of i-ray output.

Figure 7:
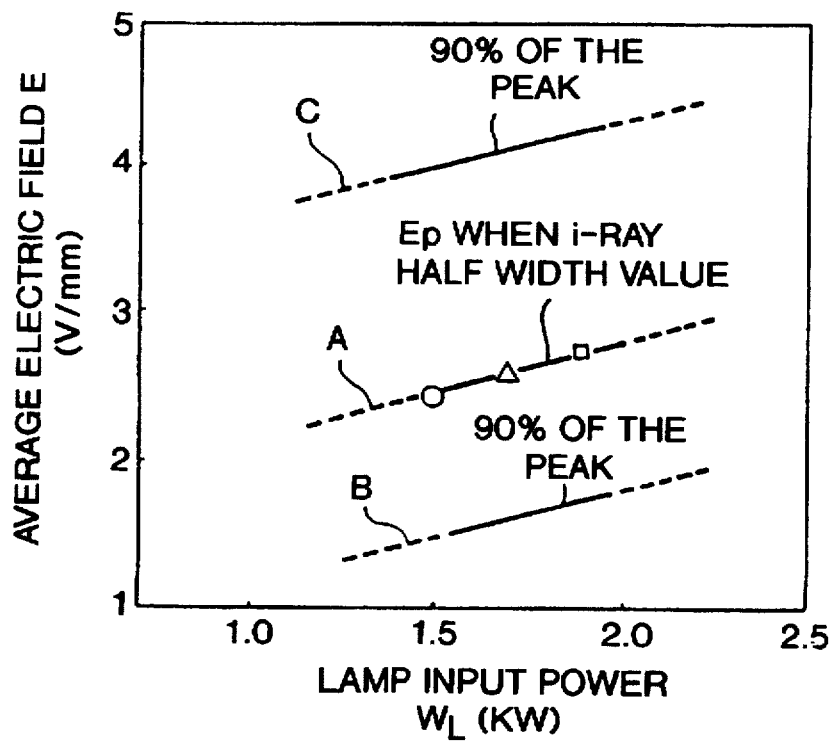
FIG. 7 is a chart showing a relationship between a lamp input power and an average electric field.

FIG. 7 is a chart showing the average electric fields $E_p(W_L)$, where the peak value of i-ray illuminance is obtained, plotted against the lamp input power. The lamp input power $W_L$ and the average electric field $E_p(W_L)$, where i-ray illuminance assumes a peak value, have a linear relationship which can be expressed by $E_p(W_L)=a+bW_L$ (Line A). Looking at FIG. 7, the constants a and b are found to be a=1.4 V/mm and b=0.71×10$^{-3}$ V/mm·W. When the average electric fields E, where 90% of the peak value of i-ray illuminance is obtained, are plotted likewise, Lines B and C are obtained. The linear equation for Line B can be expressed by $E_p(W_L)-1.0$ V/mm, while that for Line C can be expressed by $E_p(W_L)+1.5$ V/mm. Accordingly, an i-ray can be emitted very efficiently, even under a constant lamp input power, if the mercury lamp is lit under the conditions where the average electric field E and the lamp input power $W_L$ are included within the range between Lines B and C.

Figure 8:
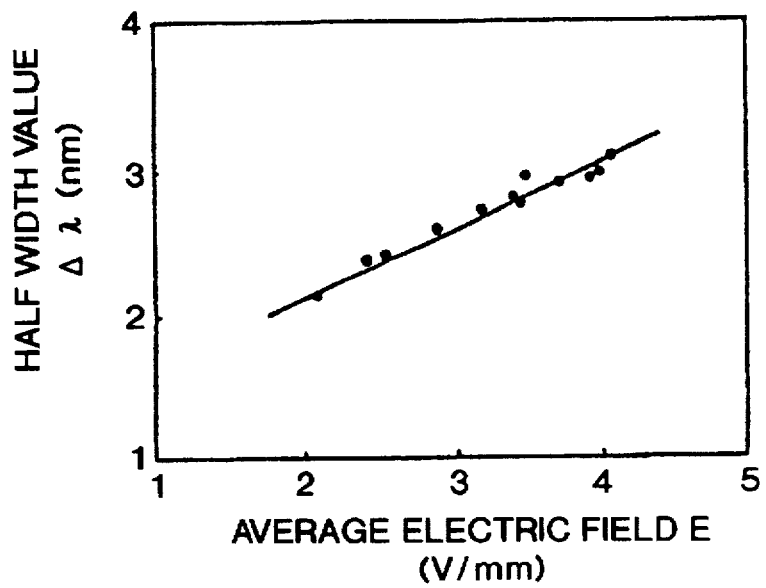
FIG. 8 is a chart showing a relationship between an average electric field and an i-ray half width value.

FIG. 8 is a chart showing the relationship between the half width value $\Delta\lambda$ of the i-ray and the average electric field E. The half width value $\Delta\lambda$ of the i-ray and the average electric field E display a linear relationship, irrespective of the lamp voltage. Namely, the larger the average electric field E is, the greater the i-ray half width value $\Delta\lambda$ becomes. The range where correction of chromatic aberration, in the projection optical system 8 shown in FIG. 5, is possible is about 4 nm, in terms of the i-ray half width value. Accordingly, in order to secure a i-ray width value of 4 nm or less, the average electric field should be 6 V/mm or less.

Figure 9:
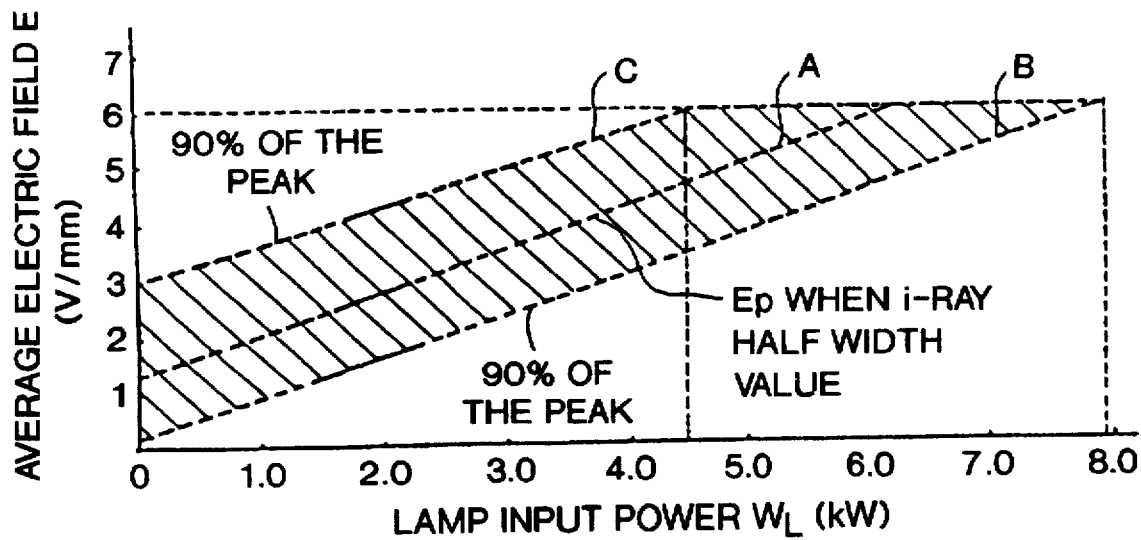
FIG. 9 is a chart showing an optimum range of lamp input power and average electric field.

FIG. 9 is a chart showing the range where the i-ray half width value of 4 nm or less can be secured under extremely efficient irradiation of i-ray. First, in order to obtain an average electric field E of 6 V/mm or less, based on the linear equation of Line C shown in FIG. 7, the lamp input power $W_L$ is set to $W_L \leq 4.5$ kw, based on the relationship of $E_p(W_L)+1.5$ V/mm$\leq$V/mm. Meanwhile, to secure an average electric field E of 6 V/mm or less, based on the linear equation of Line B shown in FIG. 7, the lamp input power $W_L$ is set to $W_L \leq 7.9$ kW, based on the relationship of $E_p(W_L)-1.0$ V/mm$\leq$6 V/mm. Accordingly, it can be appreciated that the mercury lamp may be lit under the conditions of the average electric field E and the lamp input power $W_L$ in the region of the hatching shown in FIG. 9. The conditional expression may be summarized as follows:

$$E_p(W_L)-1.0 \text{ V/mm} \leq E \leq E_p(W_L)+1.5 \text{ V/mm}, E \leq 6 \text{ V/mm, wherein}$$
$$E_p(W_L)=a+bW_L, a=1.4 \text{ V/mm and } b=0.71\times 10^{-3} \text{ V/mm·W}$$

As described above, if the respective values are included in the range of the hatching in FIG. 9, or they satisfy the above conditional expression, an i-ray can securely be efficiently emitted under a notably reduced half width value, as compared with the prior art mercury lamps. Accordingly, an exposure can be realized having a high throughput with a greatly reduced load. This leads to the correction of chromatic aberrations in the projection optical system.

Although a preferred embodiment of the present invention has been shown and described, it would be appreciated by those skilled in the art that changes may be made in the embodiment without departing from the principles and spirit of the invention, the scope of which is defined in the claims and their equivalents.

What is claimed is:

1. A semiconductor exposure device comprising:

an illumination optical system for illuminating a target surface having
        a mercury lamp having two electrodes;
        an optical integrator;
        an optical system for guiding light emitted from said mercury lamp to said optical integrator; and
        a condenser lens for converging the light emitted from said optical integrator;

a projection optical system for projecting the light onto said target surface; and a power source for supplying an electric current to said mercury lamp, the power source imparting an average electric field E to said mercury lamp satisfying:

$$E_p(W_L)-1.0 \text{ V/mm} \leq E \leq E_p(W_L)$$

where $E_p(W_L)=a+bW_L$, $W_L$ is equal to the lamp input power, $E \leq 6$ V/mm, a and b are constants and E=$(V_L-11)/d$ where $V_L$ is equal to the lamp voltage and d is equal to the distance between the two electrodes of said mercury lamp.

2. A semiconductor exposure device, as set forth in claim 1, wherein a=1.4 V/mm and b=0.71×10$^{-3}$ V/mm·W.

3. A power supply for a mercury lamp having a plurality of electrodes, the power supply comprising:

a power source to supply an electric current; and
    a control circuit to regulate the power source such that the mercury lamp has an average electric field E satisfying:

$$E_p(W_L)-1.0 \text{ V/mm} \leq E \leq E_p(W_L)$$

where $E_p(W_L)=a+bW_L$, $W_L$ is equal to the lamp input power, $E \leq 6$ V/mm, a and b are constants and E=$(V_L-11)/d$ where $V_L$ is equal to the lamp voltage and d is equal to the distance between the two electrodes of said mercury lamp.

* * * * *

UNITED STATES PATENT AND TRADEMARK OFFICE
CERTIFICATE OF CORRECTION

PATENT NO. : 5,791,767
DATED : August 11, 1998
INVENTOR(S) : Osamu INOUE, et al.

It is certified that error appears in the above-indentified patent and that said Letters Patent is hereby corrected as shown below:

Title page, [73] should be --Nikon Corporation, Tokyo, Japan and Ushio Denki Kabushiki Kaisha, Tokyo, Japan--.